United States Patent
Chang et al.

(10) Patent No.: US 11,218,119 B2
(45) Date of Patent: Jan. 4, 2022

(54) COMMUNICATION SYSTEM AND OUTPUT POWER LINEARIZATION METHOD THEREOF

(71) Applicant: Realtek Semiconductor Corporation, Hsinchu (TW)

(72) Inventors: Yuan-Shuo Chang, Hsinchu (TW); Shin-Lin Cheng, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/205,194

(22) Filed: Mar. 18, 2021

(65) Prior Publication Data

US 2021/0320629 A1 Oct. 14, 2021

(30) Foreign Application Priority Data

Apr. 14, 2020 (TW) .................................. 109112479

(51) Int. Cl.
*H03F 1/32* (2006.01)
*H04B 1/04* (2006.01)
(Continued)

(52) U.S. Cl.
CPC .......... *H03F 1/3247* (2013.01); *H04B 1/0017* (2013.01); *H04B 1/0475* (2013.01);
(Continued)

(58) Field of Classification Search
CPC ... H04B 1/0017; H04B 1/0475; H03F 1/3247; H03F 2201/3215; H04L 27/368
(Continued)

(56) References Cited

U.S. PATENT DOCUMENTS

2016/0065147 A1* 3/2016 Pratt ..................... H03F 3/195
330/75
2016/0191087 A1 6/2016 Kim et al.
(Continued)

FOREIGN PATENT DOCUMENTS

| CN | 101505139 B | 8/2011 |
|---|---|---|
| CN | 103731105 A | 4/2014 |
| CN | 106941466 A | 7/2017 |

OTHER PUBLICATIONS

G. Su et al., "A Robust and Low Sampling Rate Digital Predistortion Algorithm for Broadband PA Modeling and Predistortion", IEEE, 2014, pp. 1-4.

*Primary Examiner* — Kevin M Burd
(74) *Attorney, Agent, or Firm* — Locke Lord LLP; Tim Tingkang Xia, Esq.

(57) ABSTRACT

A communication system is provided, which includes a power amplifier, a receive-end filter, an ADC, an output simulation circuit, and a predistortion circuit. The power amplifier amplifies a RF input signal to generate a RF output signal. The RF input signal is generated according to a baseband signal. The receive-end filter filters a feedback signal generated according to the RF output signal to output a filtered feedback signal. A bandwidth of the filtered feedback signal is at least 3 to 5 times a bandwidth of the RF input signal. The ADC converts the filtered feedback signal to a digital input signal. The output simulation circuit generates, according to the digital input signal and the baseband signal, a reference signal simulating the RF output signal. The predistortion circuit builds a predistortion model according to the reference signal.

11 Claims, 7 Drawing Sheets

(51) Int. Cl.
*H04L 27/36* (2006.01)
*H04B 1/00* (2006.01)

(52) U.S. Cl.
CPC .... *H04L 27/368* (2013.01); *H03F 2201/3215* (2013.01); *H04B 2001/0425* (2013.01)

(58) Field of Classification Search
USPC .......................................................... 375/297
See application file for complete search history.

(56) References Cited

U.S. PATENT DOCUMENTS

2017/0012590 A1* 1/2017 Fong ...................... H04B 17/13
2018/0167093 A1* 6/2018 Miyazaki .................. H03F 3/24

\* cited by examiner

COMMUNICATION SYSTEM AND OUTPUT POWER LINEARIZATION METHOD THEREOF

CROSS-REFERENCE TO RELATED APPLICATION

This application claims priority to Taiwan Application Number 109112479, filed on Apr. 14, 2020, which is herein incorporated by reference in its entirety.

BACKGROUND

Technical Field

The present disclosure generally relates to a communication system. More particularly, the present disclosure relates to a communication system can simulate characteristics of a power amplifier thereof to linearize the output power.

Description of Related Art

Since a power amplifier in a communication system is a non-linear component, a bandwidth of a radio frequency (RF) signal may be greatly expanded after the RF signal is amplified, causing the communication system with output quality degradation and potential telecommunication regulation violations. Methods such as digital predistortion and power back-off are usually used to increase the linearity of the power amplifier. A traditional digital predistortion method usually arranges an analog filter on a feedback path to reduce a bandwidth of a feedback signal so as to mitigate requirements in respect of resolution and bandwidth of an analog-to-digital converter (ADC) in the post-stage circuits. However, this solution may reduce available information for building a predistortion model and lower the chance for retrieving correct compensation parameters.

SUMMARY

The disclosure provides a communication system including a power amplifier, a receive-end filter, an analog-to-digital converter (abbr., ADC), an output simulation circuit, and a predistortion circuit. The power amplifier is configured to amplify a radio frequency (abbr., RF) input signal to generate a RF output signal, in which the RF input signal is generated according to a baseband signal. The receive-end filter is configured to filter a feedback signal generated according to the RF output signal to output a filtered feedback signal, in which a bandwidth of the filtered feedback signal is at least 3 to 5 times a bandwidth of the RF input signal. The ADC is configured to convert the filtered feedback signal to a digital input signal. The output simulation circuit is configured to generate, according to the digital input signal and the baseband signal, a reference signal simulating the RE output signal. The predistortion circuit is configured to build a predistortion model according to the reference signal.

The disclosure provides another communication system including a power amplifier, a receive-end filter, an ADC, and a digital logic circuit. The power amplifier is configured to amplify a RF input signal to generate a RF output signal, in which the RF input signal is generated according to a baseband signal. The receive-end filter is configured to filter a feedback signal generated according to the RF output signal to output a filtered feedback signal, in which a bandwidth of the filtered feedback signal is at least 3 to 5 times a bandwidth of the RF input signal. The ADC is configured to convert the filtered feedback signal to a digital input signal. The digital logic circuit is configured to simulate, according to the digital input signal and the baseband signal, input-output characteristics of the power amplifier to generate a simulation result. The digital logic circuit is further configured to build a predistortion model according to the simulation result.

The disclosure provides an output power linearization method suitable for a communication system. The output power linearization method includes the following operations: utilizing a power amplifier of the communication system to amplify a RF input signal to generate a RF output signal, wherein the RF input signal is generated according to a baseband signal; generating a feedback signal according to the RF output signal, and filtering the feedback signal to generate a filtered feedback signal, wherein a bandwidth of the filtered feedback signal is at least 3 to 5 times a bandwidth of the RF input signal; utilizing an ADC of the communication system to perform an analog-to-digital conversion to the filtered feedback signal so as to convert the filtered feedback signal to a digital input signal; generating, according to the digital input signal and the baseband signal, a reference signal simulating the RF output signal; and building a predistortion model according to the reference signal.

The foregoing communication system and output power linearization method thereof are able to implement an accurate predistortion model based on comprehensive information of the RF output signal. It is to be understood that both the foregoing general description and the following detailed description are by examples, and are intended to provide further explanation of the disclosure as claimed.

DETAILED DESCRIPTION

Figure 1:
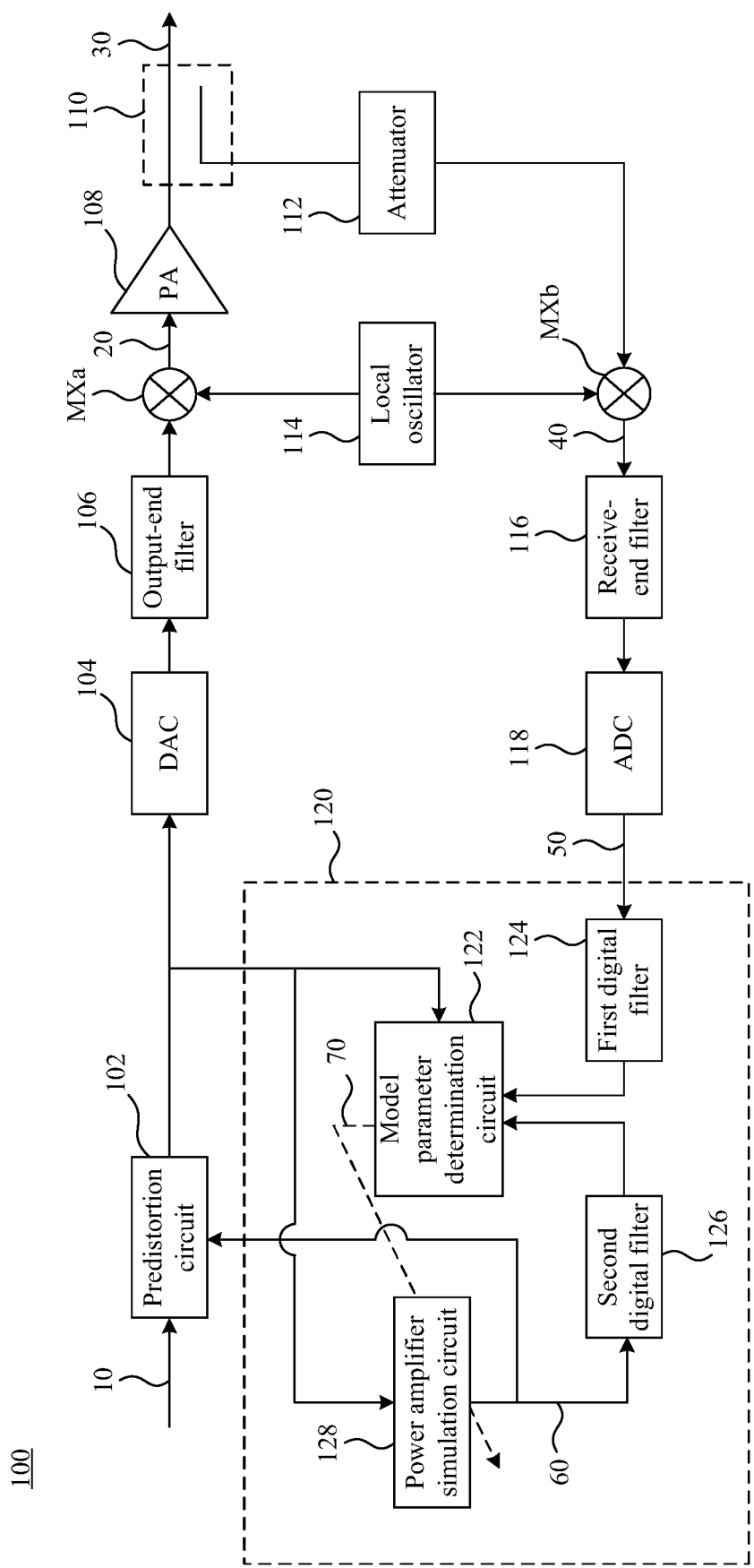
FIG. 1 is a simplified functional block diagram of a communication system according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a simplified functional block diagram of a communication system 100 according to one embodiment of the present disclosure. The communication system 100 comprises a predistortion circuit 102, a digital-to-analog converter (abbr., DAC) 104, an output-end filter 106, a power amplifier 108, a coupler 110, an attenuator 112, a local oscillator 114, a receive-end filter 116, an analog-to-digital converter (abbr., ADC) 118, an output simulation circuit 120, a mixer MXa, and a mixer MXb. The predistortion circuit 102 is configured to perform predistortion to the baseband signal 10, and configured to transmit the baseband signal 10 processed by predistortion to the DAC 104. An input terminal and an output terminal of the DAC 104 are coupled to the predistortion circuit 102 and the output-end filter 106, respectively, in which the output-end filter 106 is configured to filter the baseband signal 10 having an analog form. The local oscillator 114 and the mixer MXa are configured to modulate the baseband signal 10 outputted by the output-end filter 106 to generate a radio frequency (abbr., RF) input signal 20. Then, the power amplifier 108 amplifies the RF input signal 20 to generate a RF output signal 30. The communication system 100 can use the feedback path shown in FIG. 1 to adaptively adjust a predistortion model in the predistortion circuit 102, in which the predistortion model is configured to increase the linearity of the power amplifier 108.

Specifically, the coupler 110 and the attenuator 112 are configured to feedback part of the RF output signal 30. In practice, the coupler 110 can be implemented by a metal wire in parallel with a transmission line coupled between the power amplifier 108 and a post-stage load. The local oscillator 114 and the mixer MXb demodulate the signal outputted by the attenuator 112 to generate a feedback signal 40. The receive-end filter 116 is configured to filter noise generated by the attenuator 112 and the mixer MXb, and configured to transmit the filtered feedback signal 40 to the ADC 118.

Figure 2A:
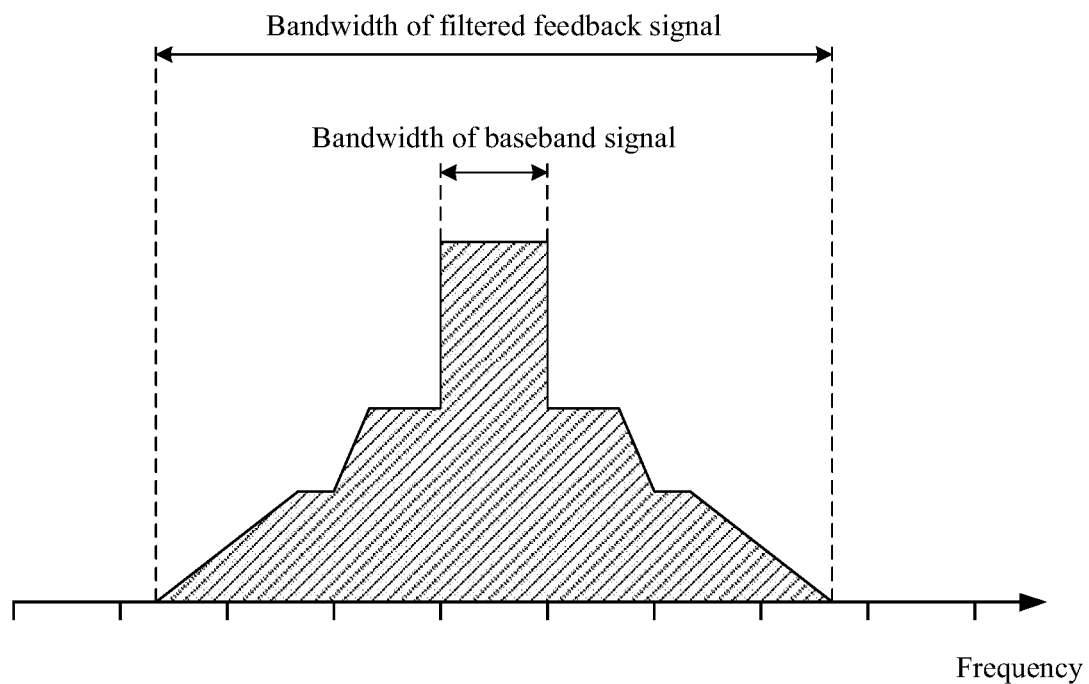
FIG. 2A is a schematic diagram of a frequency spectrum of the feedback signal filtered by the receive-end filter according to one embodiment of the present disclosure.

FIG. 2A is a schematic diagram of a frequency spectrum of the feedback signal 40 filtered by the receive-end filter 116 according to one embodiment of the present disclosure. Reference is made to FIG. 1 and FIG. 2A. In the process of building the predistortion model in the predistortion circuit 102, a bandwidth of the RF output signal 30 may be expended to at least 3 to 5 times a bandwidth of the RF input signal 20. On the other hand, the noise generated by the attenuator 112 and the mixer MXb may have a frequency higher than the highest frequency among multiple frequency components of the RF output signal 30. Therefore, the feedback signal 40 received by the receive-end filter 116 not only includes components corresponding to the RE output signal 30, but also includes the noise generated by the attenuator 112 and the mixer MXb in a high frequency band. As shown in FIG. 2A, the receive-end filter 116 filters at least part of the noise generated by the attenuator 112 and the mixer MXb, while remains the components corresponding to the RF output signal 30 in the filtered feedback signal 40.

In other words, a bandwidth of the filtered feedback signal 40 may also be at least 3 to 5 times the bandwidth of the RF input signal 20. Since the receive-end filter 116 remains most of the components corresponding to the RF output signal 30 in the feedback signal 40, the output simulation circuit 120 and the predistortion circuit 102 can obtain adequate information for calculating in operations described following so as to build an accurate predistortion model.

Reference is made again to FIG. 1. The ADC 118 converts the filtered feedback signal 40 to a digital input signal 50. The output simulation circuit 120 generates, according to the digital input signal 50 and the baseband signal 10 outputted by the predistortion circuit 102, a reference signal 60 configured to simulate the RF output signal 30. As a result, the predistortion circuit 102 can obtain, from the reference signal 60, information with respect to input-output characteristics of the power amplifier 108, and thus a suitable predistortion model can be built in order to increase the linearity of the power amplifier 108.

Figure 2B:
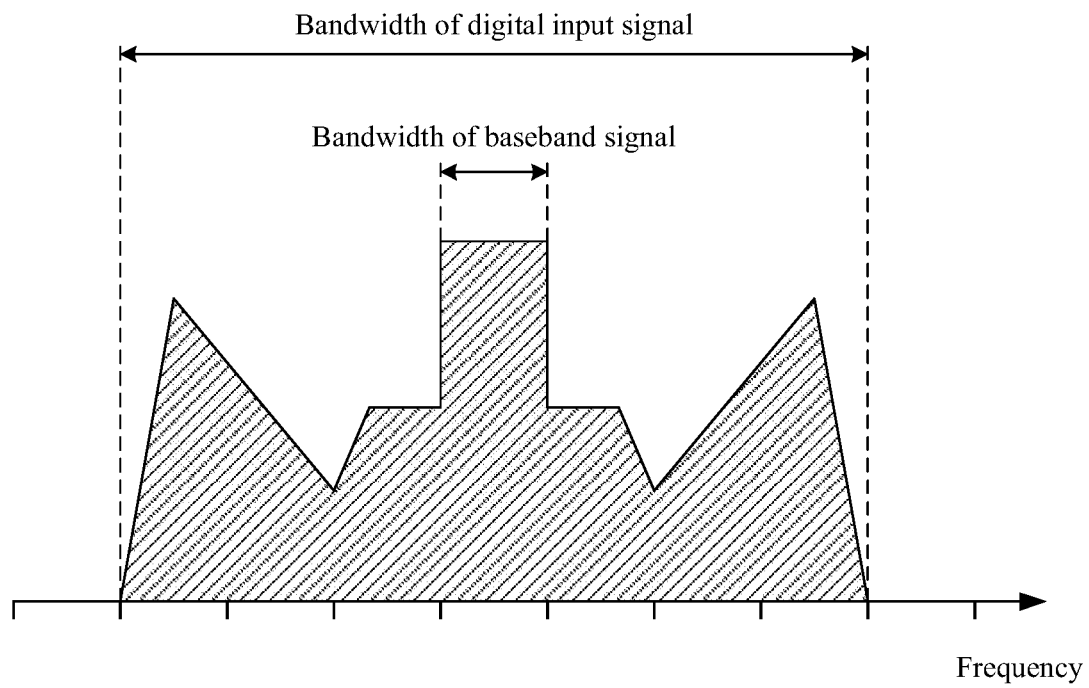
FIG. 2B is a schematic diagram of a frequency spectrum of the digital input signal according to one embodiment of the present disclosure.

FIG. 2B is a schematic diagram of a frequency spectrum of the digital input signal 50 according to one embodiment of the present disclosure. As shown in FIG. 2B, because of the noise shaping effect of the ADC 118, quantization noise may be mainly located in the high frequency band of the digital input signal 50. In some embodiments, the ADC 118 can be implemented by a continuous-time Sigma-Delta ADC having high input bandwidth and high resolution.

The output simulation circuit 120 comprises a model parameter determination circuit 122, a first digital filter 124, a second digital filter 126, and a power amplifier simulation circuit 128. The first digital filter 124 is coupled to the ADC 118, and is configured to filter the high-frequency quantization noise in the digital input signal 50. As a result, the output simulation circuit 120 and the predistortion circuit 102 are less likely to erroneously recognize characteristics of the RF output signal 30 such as waveform, frequency spectrum, etc., and building of an incorrect predistortion model can be avoided.

Figure 2C:
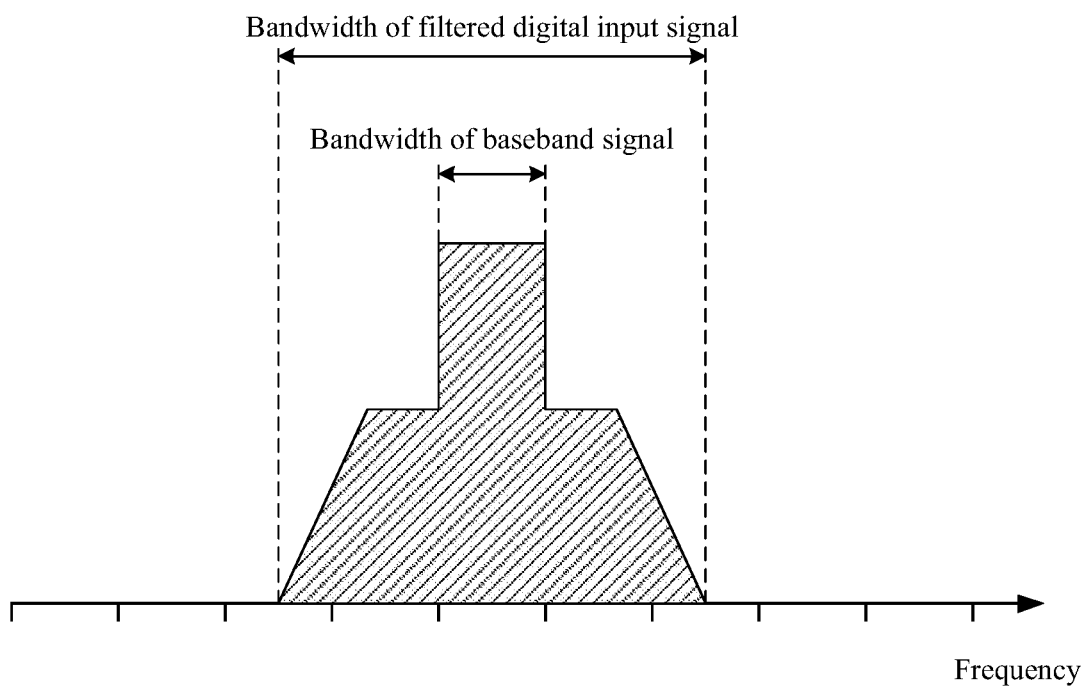
FIG. 2C is a schematic diagram of a frequency spectrum of the digital input signal filtered by the first digital filter according to one embodiment of the present disclosure.

FIG. 2C is a schematic diagram of a frequency spectrum of the digital input signal 50 filtered by the first digital filter 124 according to one embodiment of the present disclosure. The first digital filter 124 transmits the filtered digital input signal 50 to the model parameter determination circuit 122. In addition, the second digital filter 126 is coupled between the power amplifier simulation circuit 128 and the model parameter determination circuit 122, and is configured to filter the reference signal 60. The second digital filter 126 transmits the filtered reference signal 60 to the model parameter determination circuit 122, in which the reference signal 60 is generated by the power amplifier simulation circuit 128 according to the baseband signal 10 outputted by the predistortion circuit 102.

In some embodiments, the configurations of the first digital filter 124 and the second digital filter 126 are substantially identical. For example, the first digital filter 124 and the second digital filter 126 may have the same cut-off frequency so that the filtered digital input signal 50 and the filtered reference signal 60 may have the same or similar bandwidth.

The model parameter determination circuit 122 is configured to provide, according to the baseband signal 10, the filtered digital input signal 50, and the filtered reference signal 60, an adjustment signal 70 to the power amplifier simulation circuit 128. The model parameter determination circuit 122 compares the filtered digital input signal 50 with the filtered reference signal 60 so as to determine, according to the comparison result, one or more parameters included by the adjustment signal 70. The power amplifier simulation circuit 128 adjusts a power amplifier model thereof according to the one or more parameters carried by the adjustment signal 70 to render the reference signal 60 approximating to the RF output signal 30, in which the power amplifier model is a built-in model of the power amplifier simulation circuit 128. In other words, the adjustment signal 70 is configured to render the reference signal 60 approximating to the RF output signal 30.

In some embodiments, the model parameter determination circuit 122 performs the least squares method to generate the adjustment signal 70.

In other embodiments, to allow the built-in power amplifier model of the power amplifier simulation circuit 128 faithfully presents the characteristics of the power amplifier 108, the model parameter determination circuit 122 may dynamically (e.g., for multiple times) change the adjustment signal 70. When the model parameter determination circuit 122 dynamically changes the adjustment signal 70, the filtered reference signal 60 is dynamically approximated to the filtered digital input signal 50. That is, the reference signal 60 is dynamically approximated to the RF output signal 30.

Figure 3:
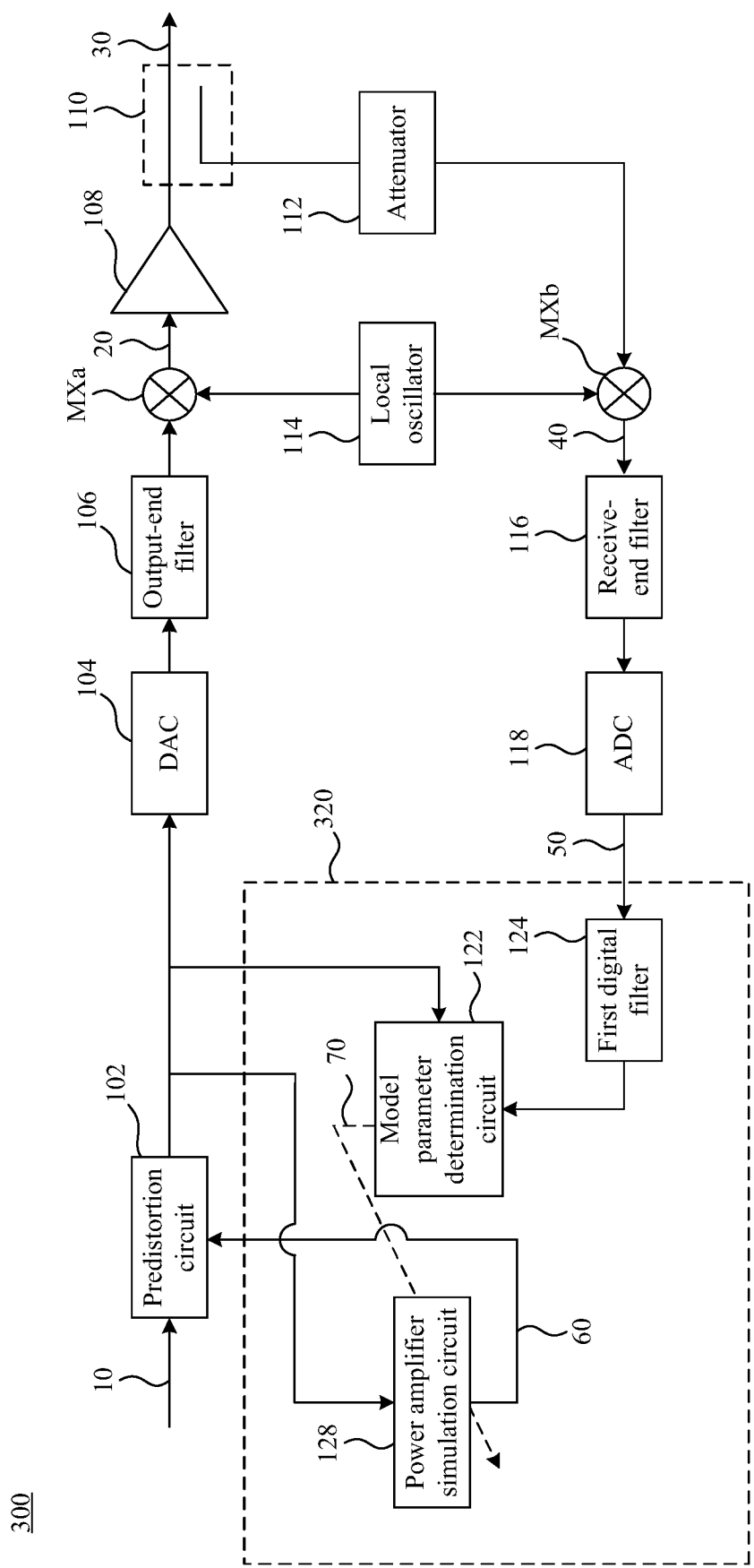
FIG. 3 is a simplified functional block diagram of a communication system according to one embodiment of the present disclosure.

FIG. 3 is a simplified functional block diagram of a communication system 300 according to one embodiment of the present disclosure. The communication system 300 is similar to the communication system 100 of FIG. 1, in which one of the differences is that the aforementioned second digital filter 126 is not a necessary part of the output simulation circuit 320. The model parameter determination circuit 122 of the output simulation circuit 320 can calculate, according to the difference between the baseband signal 10 outputted by the predistortion circuit 102 and the filtered digital input signal 50, the one or more parameters required by the power amplifier simulation circuit 128 (i.e., the one or more parameters of the adjustment signal 70).

In one embodiment, the model parameter determination circuit 122 of the communication system 300 only performs the least squares method once to obtain the one or more parameters required by the power amplifier simulation circuit 128.

As can be appreciated from the foregoing descriptions, the communication system 300 not only further reduces the circuit area, but also helps to accelerate the speed of building the predistortion model. The foregoing descriptions regarding the implementations, connections, operations, and related advantages of other corresponding functional blocks in the communication system 100 are also applicable to the communication system 300. For the sake of brevity, those descriptions will not be repeated here.

Figure 4:
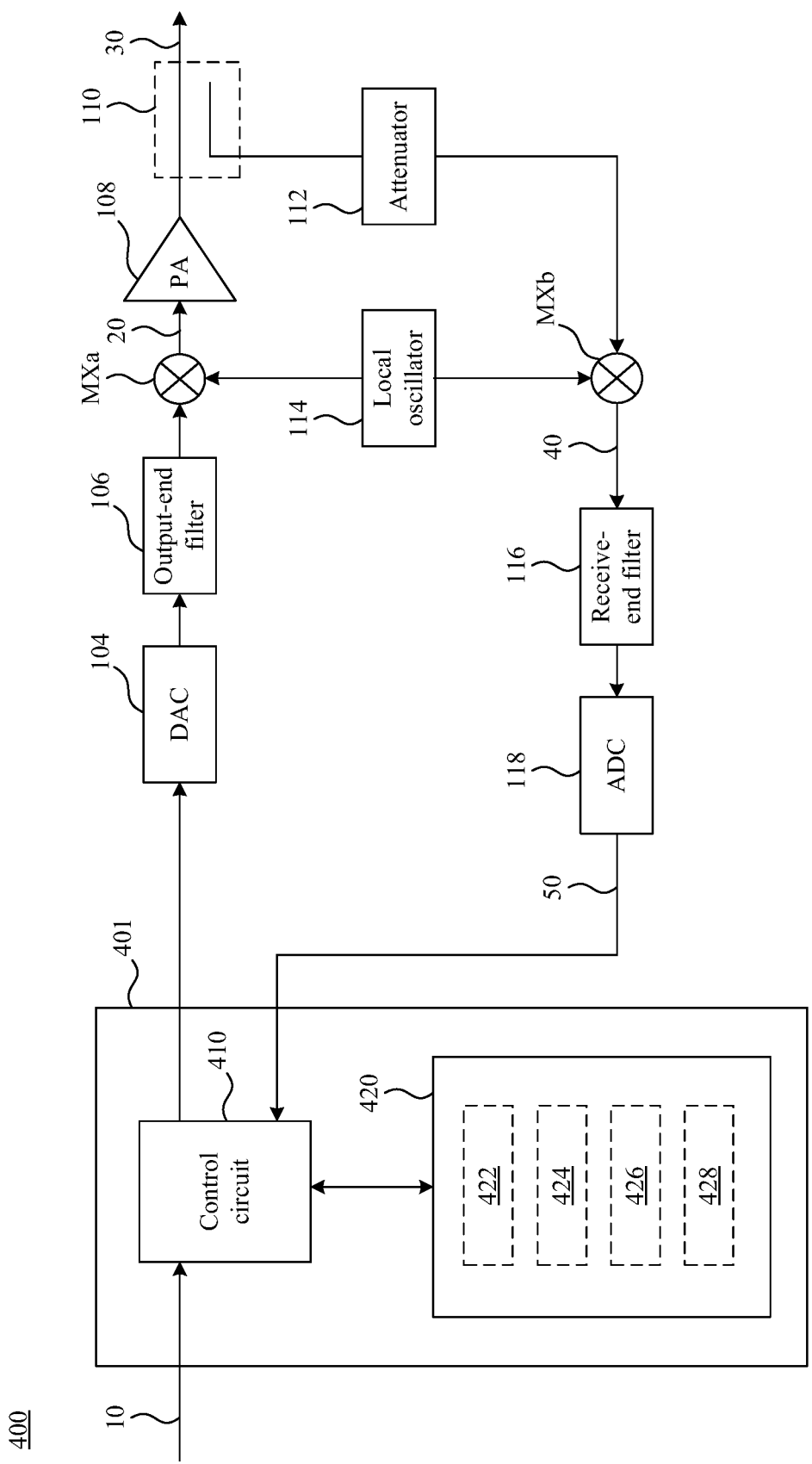
FIG. 4 is a simplified functional diagram of a communication system according to one embodiment of the present disclosure.

FIG. 4 is a simplified functional diagram of a communication system 400 according to one embodiment of the present disclosure. In this embodiment, the digital logic circuit 401 is configured to realize the functions performed by the predistortion circuit 102 and output simulation circuit 120 of FIG. 1. That is, the digital logic circuit 401 simulates, according to the digital input signal 50 and the baseband signal 10, the input-output characteristics of the power amplifier 108 to generate a simulation result. Then, the digital logic circuit 401 adaptively adjusts a pre-stored predistortion model according to the simulation result, in which the predistortion model is stored in the digital logic circuit 401 and configured to increase the linearity of the power amplifier 108.

The digital logic circuit 401 comprises a control circuit 410 and a memory 420. The control circuit 410 may read and execute the following modules implemented by codes and stored in the memory 420: a model parameter determination module 422, a first digital filter module 424, a second digital filter module 426, and a power amplifier simulation module 428; in which these modules are configured to respectively implement the functions performed by the model parameter determination circuit 122, the first digital filter 124, the second digital filter 126, and the power amplifier simulation circuit 128 of FIG. 1. For the sake of brevity, those descriptions will not be repeated here.

In this embodiment, the aforementioned reference signal 60, adjustment signal 70, filtered digital input signal 50, and filtered reference signal 60 each can be implemented by one or more digital data stored in the memory 420. For example, the control circuit 410 may execute the first digital filter module 424 to obtain a complex exponential function corresponding to the filtered digital input signal 50, and store the complex exponential function in one or more addresses of the memory 420, and so forth.

In some embodiments, the second digital filter module 426 needs not to be stored in the memory 420. In this situation, control circuit 410 may read and execute the following modules stored in the memory 420: the model parameter determination module 422, the first digital filter module 424, and the power amplifier simulation module 428; in which these modules are configured to respectively implement the functions performed by the model parameter determination circuit 122, the first digital filter 124, and the power amplifier simulation circuit 128 of FIG. 3. For the sake of brevity, those descriptions will not be repeated here.

Figure 5:
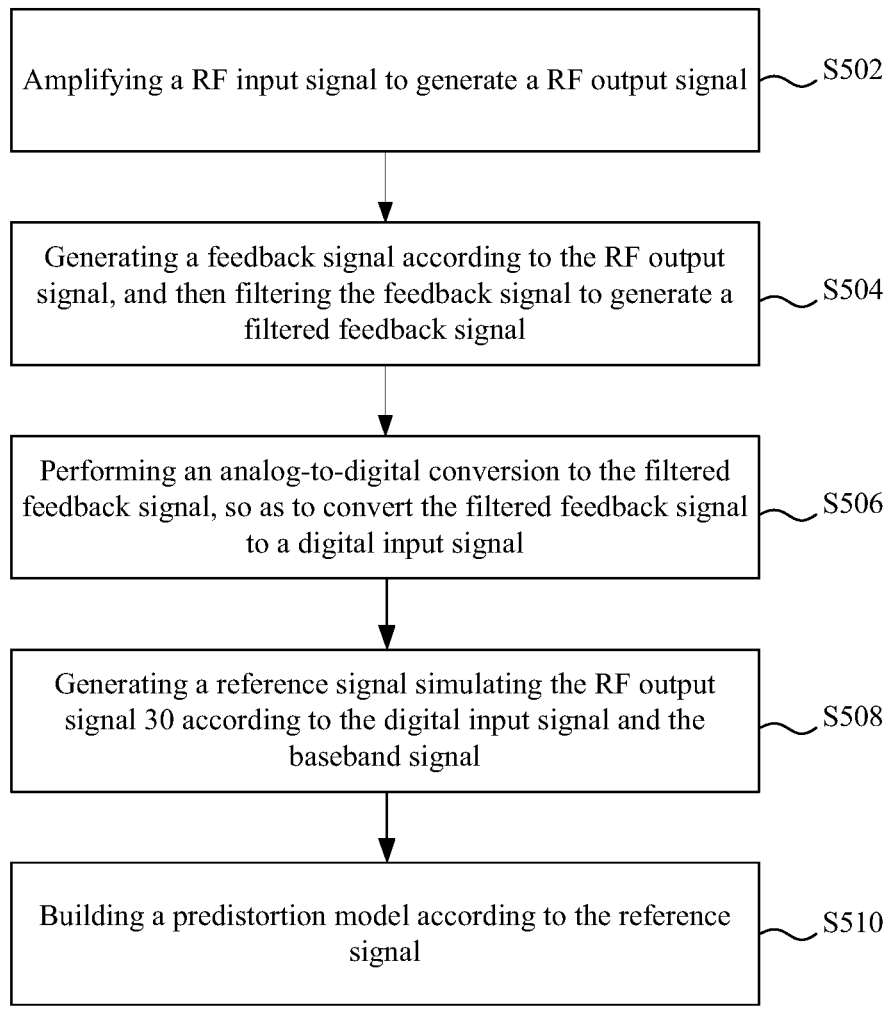
FIG. 5 is a flowchart of an output power linearization method according to one embodiment of the present disclosure.

FIG. 5 is a flowchart of an output power linearization method 500 according to one embodiment of the present disclosure. The output power linearization method 500 comprises the following operations S502-S510.

In operation S502, a power amplifier 108 of a communication system (e.g., the aforementioned communication system 100, 300, or 400) is utilized to amplify the RF input signal 20 to generate the RF output signal 30, in which the RF input signal 20 is generated according to the baseband signal 10.

In operation S504, the feedback signal 40 is generated according to the RF output signal 30, and then the feedback signal 40 is filtered to generate the filtered feedback signal 40. The bandwidth of the filtered feedback signal 40 may be at least 3 to 5 times the bandwidth of the RF input signal 20. For example, the receive-end filter 116 of FIG. 1 may be used to filter at least part of noise generated by the attenuator 112 and the mixer MXb to generate the filtered feedback signal 40, in which the frequency of the noise generated by the attenuator 112 and the mixer MXb may be higher than the highest frequency among the multiple frequency components of the RF output signal 30.

In operation S506, an ADC of the communication system (e.g., the ADC 118 of FIG. 1) is utilized to perform the analog-to-digital conversion to the filtered feedback signal 40, so as to convert the filtered feedback signal 40 to the digital input signal 50.

In operation S508, the reference signal 60 simulating the RF output signal 30 is generated according to the digital input signal 50 and the baseband signal 10.

In operation S510, a predistortion model is built according to the reference signal 60, in which the predistortion model is configured to perform predistortion to the baseband signal 10.

Figure 6:
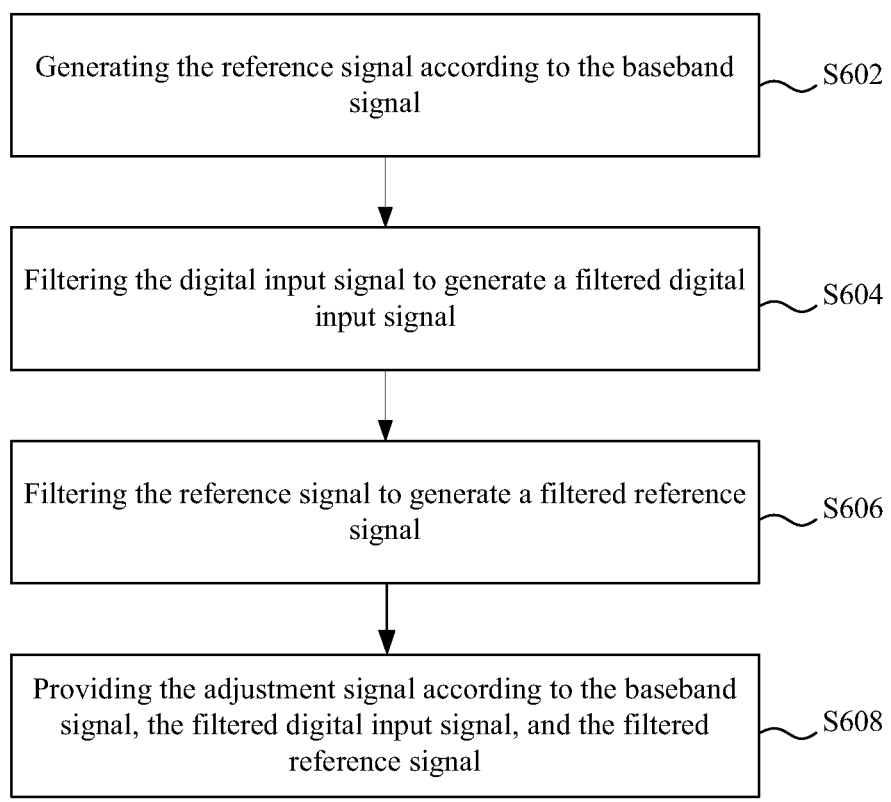
FIG. 6 is a detailed flowchart for illustrating the operation S508 of FIG. 5.

FIG. 6 is a detailed flowchart for further illustrating operation S508. Operation S508 may comprise the following operations S602-S608.

In operation S602, generating the reference signal 60 according to the baseband signal 10. For instance, the reference signal 60 can be generated by the power amplifier simulation circuit 128 of FIG. 1 by using the baseband signal 10 outputted by the predistortion circuit 102.

In operation S604, the digital input signal 50 is filtered to generate the filtered digital input signal 50.

In operation S606, the reference signal 60 is filtered to generate the filtered reference signal 60.

In operation S608, the adjustment signal 70 is provided according to the baseband signal 10, the filtered digital input signal 50, and the filtered reference signal 60, in which the adjustment signal 70 is configured to calibrate the reference signal 60 so that the reference signal 60 is approximated to the RF output signal 30. For example, the adjustment signal 70 may include one or more parameters required by the power amplifier simulation circuit 128 of FIG. 1 to adjust the built-in power amplifier model thereof.

In operation S608 of some embodiments, the adjustment signal 70 is generated by using the baseband signal 10 and the filtered digital input signal 50 only, the filtered reference signal 60 is unnecessary.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

In addition, the singular forms "a," "an," and "the" herein are intended to comprise the plural forms as well, unless the context clearly indicates otherwise.

Other embodiments of the present disclosure will be apparent to those skilled in the art from consideration of the specification and practice of the present disclosure disclosed herein. It is intended that the specification and examples be considered as exemplary only, with a true scope and spirit of the present disclosure being indicated by the following claims.

What is claimed is:

1. A communication system, comprising:
   a power amplifier, configured to amplify a radio frequency (RF) input signal to generate a RF output signal, wherein the RF input signal is generated according to a baseband signal;
   a receive-end filter, configured to filter a feedback signal generated according to the RF output signal to output a filtered feedback signal, wherein a bandwidth of the filtered feedback signal is at least 3 to 5 times a bandwidth of the RF input signal;
   an analog-to-digital converter (ADC), configured to convert the filtered feedback signal to a digital input signal;
   an output simulation circuit, configured to generate, according to the digital input signal and the baseband signal, a reference signal simulating the RF output signal, and comprising:
      a power amplifier simulation circuit, configured to provide the reference signal according to the baseband signal;
      a first digital filter, configured to filter the digital input signal to provide a filtered digital input signal;
      a second digital filter, configured to filter the reference signal to provide a filtered reference signal; and
      a model parameter determination circuit, configured to provide, according to the baseband signal, the filtered digital input signal, and the filtered reference signal, an adjustment signal to the power amplifier simulation circuit, wherein the adjustment signal is configured to render the reference signal approximating to the RF output signal; and
   a predistortion circuit, configured to build a predistortion model according to the reference signal.

2. The communication system of claim 1, wherein the ADC is a continuous-time Sigma-Delta ADC.

3. The communication system of claim 1, wherein when the model parameter determination circuit dynamically changes the adjustment signal, the filtered reference signal is dynamically approximated to the filtered digital input signal.

4. The communication system of claim 1, further comprising an attenuator coupled with the receive-end filter and a mixer coupled between the receive-end filter and the attenuator, wherein the receive-end filter is configured to filter at least part of noise generated by the attenuator and the mixer so as to generate the filtered feedback signal, and the at least part of noise generated by the attenuator and the mixer has a frequency higher than a highest frequency among a plurality of frequency components of the RF output signal.

5. A communication system, comprising:
   a power amplifier, configured to amplify a RF input signal to generate a RF output signal, wherein the RF input signal is generated according to a baseband signal;
   a receive-end filter, configured to filter a feedback signal generated according to the RF output signal to output a filtered feedback signal, wherein a bandwidth of the filtered feedback signal is at least 3 to 5 times a bandwidth of the RF input signal;
   an ADC, configured to convert the filtered feedback signal to a digital input signal; and
   a digital logic circuit, configured to simulate, according to the digital input signal and the baseband signal, input-output characteristics of the power amplifier to generate a simulation result, and configured to build a predistortion model according to the simulation result, wherein the digital logic circuit comprises a memory stored following modules:
      a power amplifier simulation module, configured to provide, according to the baseband signal, a reference signal simulating the RF output signal;
      a first digital filter module, configured to filter the digital input signal to provide a filtered digital input signal;
      a second digital filter module, configured to filter the reference signal to provide a filtered reference signal; and
      a model parameter determination module, configured to provide, according to the baseband signal, the filtered digital input signal, and the filtered reference signal, an adjustment signal to the power amplifier simulation module, wherein the adjustment signal is configured to render the reference signal approximating to the RF output signal.

6. The communication system of claim 5, wherein the ADC is a continuous-time Sigma-Delta ADC.

7. The communication system of claim 5, wherein when the model parameter determination module dynamically changes the adjustment signal, the filtered reference signal is dynamically approximated to the filtered digital input signal.

8. The communication system of claim 5, further comprises an attenuator coupled with the receive-end filter and a mixer coupled between the receive-end filter and the attenuator, wherein the receive-end filter is configured to filter at least part of noise generated by the attenuator and the mixer so as to generate the filtered feedback signal, and the at least part of noise generated by the attenuator and the mixer has a frequency higher than a highest frequency among a plurality of frequency components of the RF output signal.

9. An output power linearization method, suitable for a communication system, comprising:
   utilizing a power amplifier of the communication system to amplify a RF input signal to generate a RF output signal, wherein the RF input signal is generated according to a baseband signal;
   generating a feedback signal according to the RF output signal, and filtering the feedback signal to generate a filtered feedback signal, wherein a bandwidth of the filtered feedback signal is at least 3 to 5 times a bandwidth of the RF input signal;
   utilizing an ADC of the communication system to perform an analog-to-digital conversion to the filtered feedback signal so as to convert the filtered feedback signal to a digital input signal;
   generating, according to the digital input signal and the baseband signal, a reference signal simulating the RF output signal, wherein generating the reference signal simulating the RF output signal comprises:
      generating the reference signal according to the baseband signal;
      filtering the digital input signal to generate a filtered digital input signal;
      filtering the reference signal to generate a filtered reference signal; and
      providing, according to the baseband signal, the filtered digital input signal, and the filtered reference signal, an adjustment signal configured to calibrate the reference signal to render the reference signal approximating to the RF output signal; and
   building a predistortion model according to the reference signal.

10. The output power linearization method of claim 9, wherein the ADC is a continuous-time Sigma-Delta ADC.

11. The output power linearization method of claim 9, wherein generating the feedback signal according to the RF output signal comprises:
   filtering at least part of noise generated by an attenuator and a mixer of the communication system so as to generate the filtered feedback signal, wherein the at least part of noise generated by the attenuator and the mixer has a frequency higher than a highest frequency among a plurality of frequency components of the RF output signal.

\* \* \* \* \*